United States Patent
Poegel et al.

(10) Patent No.: US 7,245,588 B2
(45) Date of Patent: Jul. 17, 2007

(54) POWER NORMALIZATION IN WLAN RECEIVERS

(75) Inventors: Frank Poegel, Dresden (DE); Karsten Matt, Dresden (DE); Dirk Häntzschel, Porschendorf (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1040 days.

(21) Appl. No.: 10/259,706

(22) Filed: Sep. 27, 2002

(65) Prior Publication Data

US 2003/0202495 A1    Oct. 30, 2003

(30) Foreign Application Priority Data

Apr. 30, 2002  (DE)  ................ 102 19 360

(51) Int. Cl.
*H04Q 7/32* (2006.01)
(52) U.S. Cl. ...................... 370/252; 375/147
(58) Field of Classification Search ........... 370/252; 375/147
See application file for complete search history.

(56) References Cited

U.S. PATENT DOCUMENTS 5,493,712 A    2/1996  Ramesh et al.
5,623,521 A *  4/1997  Yaguchi et al. ............. 375/345
6,456,648 B1   9/2002  Bultan et al.

OTHER PUBLICATIONS

Preliminary Report on an Office Action dated Jun. 29, 2005, Aug. 3, 2005.

* cited by examiner

*Primary Examiner*—Melvin Marcelo
(74) *Attorney, Agent, or Firm*—Meyertons Hood Kivlin Kowert & Goetzel, P.C.; B. Noël Kivlin (57) ABSTRACT

A WLAN (Wireless Local Area Network) receiver is provided that has a power normalization unit that receives an input signal having a signal power within a given power range. The power normalization unit outputs a signal that is derived from the input signal by applying one of at least two different power normalization functions to the input signal. The power normalization unit comprises a power determination unit for determining the signal power, and a function selection unit for determining one of at least two subranges of the power range. The determined subrange includes the signal power. The function selection unit is further arranged for selecting one of the power normalization functions dependent on the determined subrange. By subdividing the power range and applying power normalization functions dependent on the respective subrange, simplified circuitry may be used by avoiding the calculation of the reciprocal square root function.

53 Claims, 5 Drawing Sheets

POWER NORMALIZATION IN WLAN RECEIVERS

BACKGROUND OF THE INVENTION

1. Field of the Invention

The invention generally relates to WLAN (Wireless Local Area Network) receivers and corresponding methods, and in particular to techniques for controlling the signal power part in such receivers.

2. Description of the Related Art

A WLAN system is a flexible data communication system that allows a remote user's mobile device to connect to an access point of the network (wired LAN), without having the requirement for the mobile device of being physically attached to the network, as well as to connect to a further remote user device. Thus the mobile device in a WLAN system provides for wireless mobility and additionally achieves the common functionality of wired data transfer as well as application and data access via the network.

Figure 1:
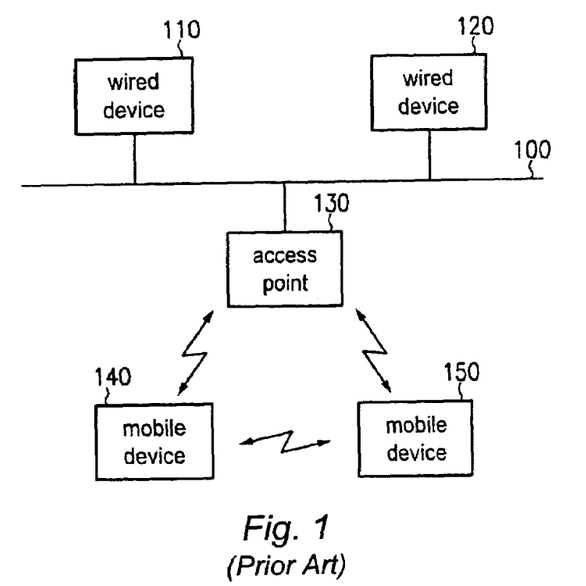
FIG. 1 illustrates a WLAN system.

As illustrated in FIG. 1, a WLAN system provides connection for mobile devices 140, 150 which are also referred to as (mobile) stations. As indicated by arrows, the mobile devices 140, 150 may communicate with an access point 130 which is connected to a wired network 100. Further the mobile devices 140, 150 can interconnect each other as well. Hence, data transfer between one of the mobile stations 140, 150 and one of wired devices 110, 120 via the access point 130 or another one of the mobile stations 140, 150 can be established.

Presently, Radio Frequency (RF) and Infra Red (IR) transmission techniques are most commonly used in wireless LANs. The industry specification IEEE 802.11 provides a standard for wireless LAN systems and products and describes direct sequence spread spectrum (DSSS) as one possible modulation technique for RF signals. Particularly when using DSSS modulation, but also when using other modulation techniques, a WLAN device internally requires a stable signal level for correctly evaluating a received signal. Hence, a change in the quality of the received signal has to be compensated before further evaluating the signal. For this purpose automatic gain control (AGC) units are provided.

Figure 2:
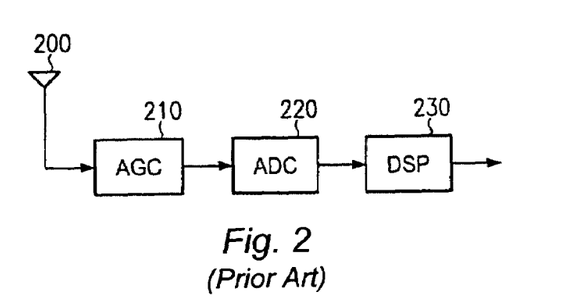
FIG. 2 is a block diagram illustrating a conventional WLAN receiver having an analog AGC unit.

Frequently, AGC units are analog circuits that receive an analog signal and generate a gain control signal for a variable gain amplifier to amplify the signal. An example of a WLAN receiver having an analog AGC unit 210 is shown in FIG. 2 where an analog-to-digital converter (ADC) 220 and a digital signal processing (DSP) unit 230 are located behind the AGC unit 210. However, conventional analog AGC units typically require a complex structure of subunits for operating with sufficient accuracy and fast settling time. Particularly in view of the general desire to reduce the size and power consumption of mobile devices this is a major difficulty of conventional analog AGC units.

Figure 3:
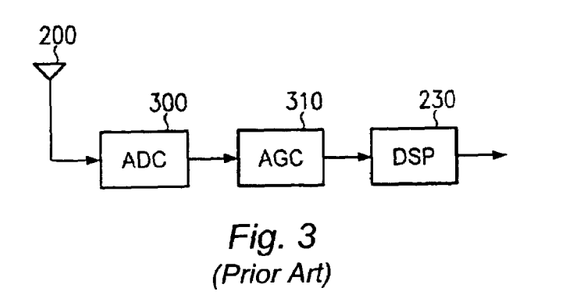
FIG. 3 is a block diagram illustrating a WLAN receiver having a digital AGC unit.

Further AGC units may exist that comprise digital units to calculate the AGC control signal. An example is given in FIG. 3 where the AGC unit 310 is located between the ADC unit 300 and the DSP unit 230. Further, there is an amplifier (not shown) located before the ADC unit 300 which needs to be controllable as otherwise the overall performance of the receiver would significantly decrease. The units shown in FIG. 3 however, due to the quantization of their internal values and the corresponding quantization of the AGC control signal, typically add some kind of oscillation to the output signal of the variable amplifier. The oscillation may hinder the correct evaluation of the amplified signal.

Hence, conventional wireless devices, in particular but not exclusively those having an AGC unit, are expensive high quality devices since they need to be built in a complex structure for providing a precise output signal level with fast settling time. However, reducing the requirements with respect to the achievable accuracy and settling time would decrease both system performance and reliability of the WLAN system.

SUMMARY OF THE INVENTION

An improved signal processing technique in a WLAN receiver is provided that may be realized using simplified hardware components, without unduly decreasing the accuracy.

In one embodiment, a WLAN receiver having a power normalization unit connected to receive an input signal having a signal power within a given power range is provided. The power normalization unit is capable of outputting an output signal derived from the input signal by applying one of at least two different power normalization functions to the input signal. The power normalization unit comprises a power determination unit for determining the signal power, and a function selection unit for determining one of at least two subranges of the power range. The determined subrange includes the signal power. The function selection unit is further arranged for selecting one of the at least two power normalization functions dependent on the determined subrange.

In another embodiment, an integrated circuit chip may be provided for performing power normalization in a WLAN receiver. The integrated circuit chip has power normalization circuitry receiving an input signal having a signal power within a given power range. The power normalization circuitry is capable of outputting an output signal derived from the input signal by applying one of at least two different power normalization functions to the input signal. The power normalization circuitry comprises power determination circuitry for determining the signal power, and function selection circuitry for determining one of at least two subranges of the power range. The determined subrange includes the signal power. The function selection circuitry is further arranged for selecting one of the at least two power normalization functions dependent on the determined subrange.

In a further embodiment, a method of performing a power normalization in a WLAN receiver is provided. The method comprises receiving an input signal having a signal power within a given power range, determining the signal power, determining one of at least two subranges of the power range with the determined subrange including the determined signal power, selecting one of the at least two power normalization functions dependent on the determined subrange, and outputting an output signal derived from the input signal by applying the selected power normalization function to the input signal.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings wherein like elements and structures are indicated by like reference numbers.

Figure 4:
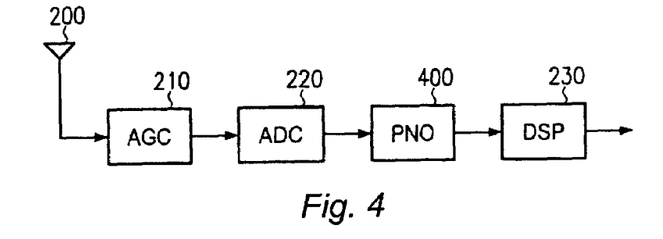
FIG. 4 is a block diagram illustrating a WLAN receiver according to an embodiment.

Referring now to the drawings and particularly to FIG. 4 which illustrates a WLAN receiver according to an embodiment, a power normalization unit (PNO) 400 is provided between the analog-to-digital converter 220 and the digital signal processing unit 230. The purpose of the power normalization unit 400 is to compensate for inaccuracies of the automatic gain control unit 210. Normally, by using the automatic gain control unit 210, the dynamic range of the analog-to-digital converter 220 may be used in an optimum manner. However, if the automatic gain control unit 210 operates imprecisely, the power normalization unit 400 may achieve proper operation of the digital processing unit 230 even if the analog-to-digital converter 220 is driven by the automatic gain control unit 210 in a non-optimum manner. This may be important in order to calculate the optimum bit widths, thresholds etc.

Figure 8:
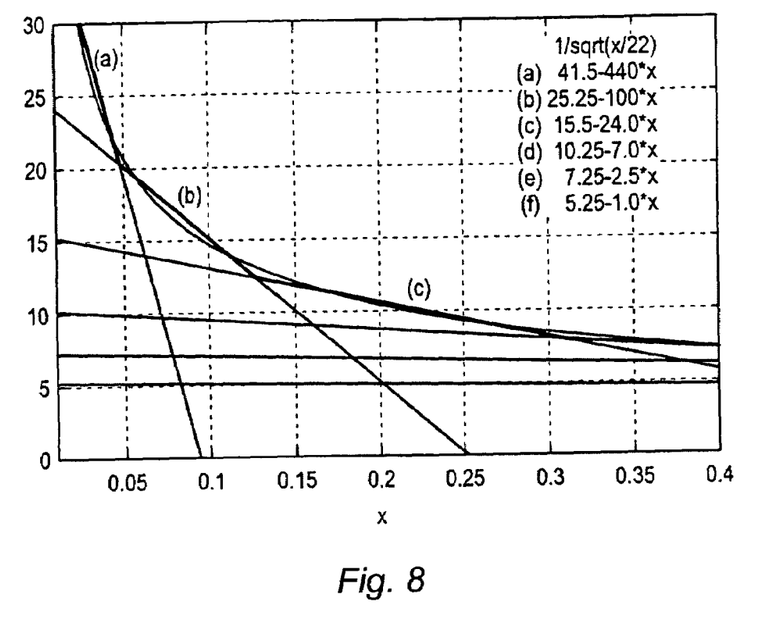
FIG. 8 is a diagram illustrating how the reciprocal square root function is approximated by a first set of linear functions.
Figure 9:
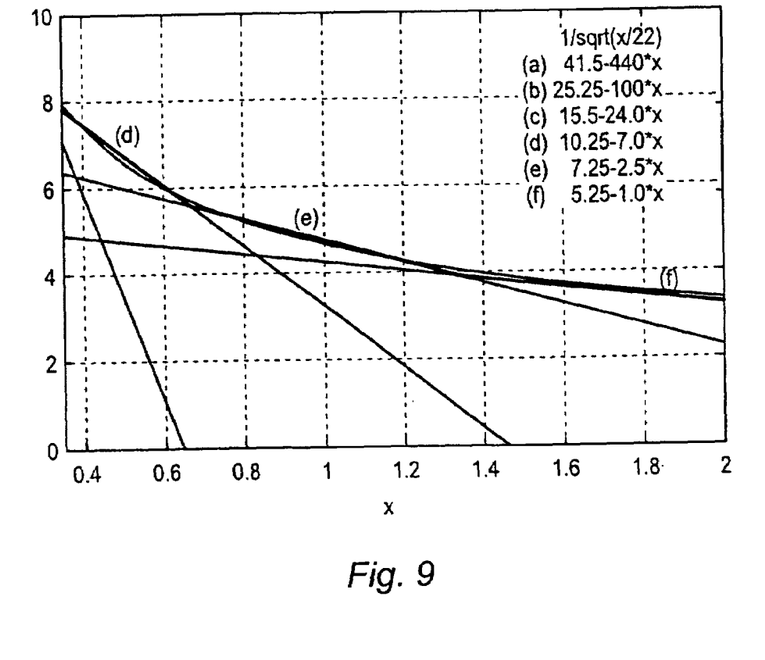
FIG. 9 is a diagram illustrating how the reciprocal square root function is approximated by a second set of linear functions.

As will be discussed in more detail below, the power normalization unit 400 makes use of at least two different power normalization functions which are selected based on the signal power of the received input signal. That is, while power normalization would normally require extensive calculation circuitry for calculating a reciprocal square root function $$\text{normalization factor} \propto 1/\sqrt{\text{Power}}$$

this can be avoided by approximating the reciprocal square root function in at least two subranges of the power range of the input signal. This will be discussed in more detail below with reference to the diagrams of FIGS. 8 and 9.

Figure 5:
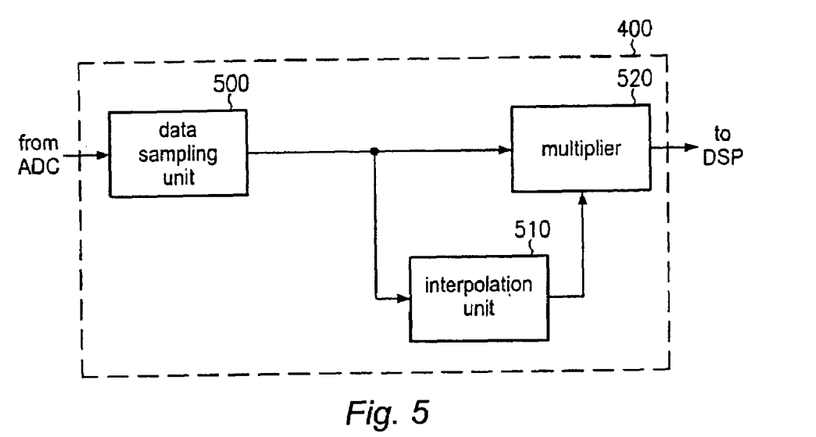
FIG. 5 illustrates the components of a power normalization unit according to a first embodiment.

Turning first to FIG. 5, a first embodiment of the power normalization unit 400 is depicted. The power normalization unit 400 comprises a data sampling unit 500 for generating data samples of the received input signal. As the input signal is received from the analog-to-digital converter 220, the input signal is a digital signal. In another embodiment, the input signal may be an analog signal, and the data sampling unit 500 would then be used to digitize the signal.

The data samples generated from the data sampling unit 500 are fed to an interpolation unit 510 that applies a linear interpolation. In detail, the interpolation unit 510 determines that subrange of the entire power range to which the input data samples relates, selects a linear interpolation function that is associated to the determined subrange, and applies the selected linear interpolation function to determine a normalization factor. The determined normalization factor is then supplied to multiplier 520 for multiplying the data sample by the normalization factor. The multiplication result is the normalized input signal and is fed to the digital signal processing unit 230.

Figure 6:
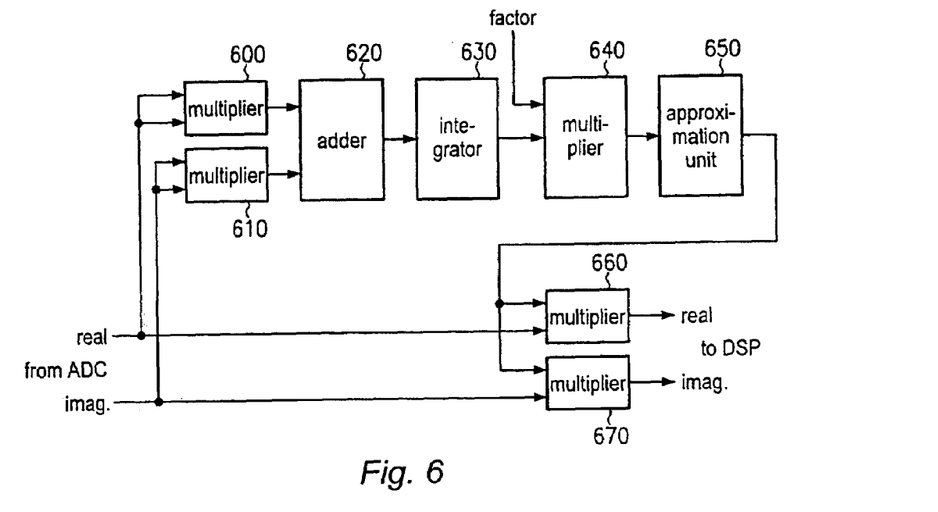
FIG. 6 illustrates the components of a power normalization unit according to a second embodiment.

Another embodiment of the power normalization unit 400 is depicted in FIG. 6. In this embodiment the power normalization unit receives both the real part as well as the imaginary part of the input signal. From both parts, the square is separately calculated by multipliers 600, 610 that each receive the respective signal twice for multiplying it by itself. The outputs of both multipliers 600, 610 are summed by adder 620, resulting in a value representative of the energy or power of the complex data sample. This value is then fed to integrator 630 for performing an integration over a number of data samples.

In the present embodiment, the integrator 630 averages over 22 or 88 complex data samples. If in the received data stream, the start of a frame is not yet detected, the integrator 630 averages over 22 samples which is the number of samples per Barker symbol. Averaging 22 data samples can be performed in a sufficiently short time to allow a short settling time without unduly reducing the precision. Once the start of the frame is detected, e.g. by detecting a specific start-of-frame delimiter in the received data stream, the integrator 630 is switched to average over 88 samples. This will increase the accuracy of the power normalization, and thus the accuracy of the entire data processing.

It is to be noted that any other number of data samples may be used in other embodiments, thus deviating from the numbers of 22 and 88 used here. While arbitrary numbers may be used, further embodiments may choose the number of data samples to be averaged (once the start of the frame is detected) to be a multiple of the number of data samples averaged before.

Turning now back to FIG. 6, the averaged energy or power output by integrator 630 is multiplied in multiplier 640 by a factor that may depend on the number of data samples used in the integrator 630 for averaging the data samples. In the embodiment of FIG. 6, if integration was done over 22 samples, the factor used in multiplier 640 is 0.5, whereas if integration was done over 88 samples, the factor is 0.125. The purpose of multiplying the output of integrator 630 with this factor is to arrive at a value that is representative of the mean power of 22 real (or imaginary) samples but not of the complex data samples.

The output of multiplier 640 is then supplied to an approximation unit 650 which approximates the reciprocal square root function by a number of power normalization functions which can be easily calculated. The normalization factor obtained by applying the approximation function to the mean power, is then used in multipliers 660, 670 to obtain normalized real and imaginary parts of the input signal.

Figure 7:
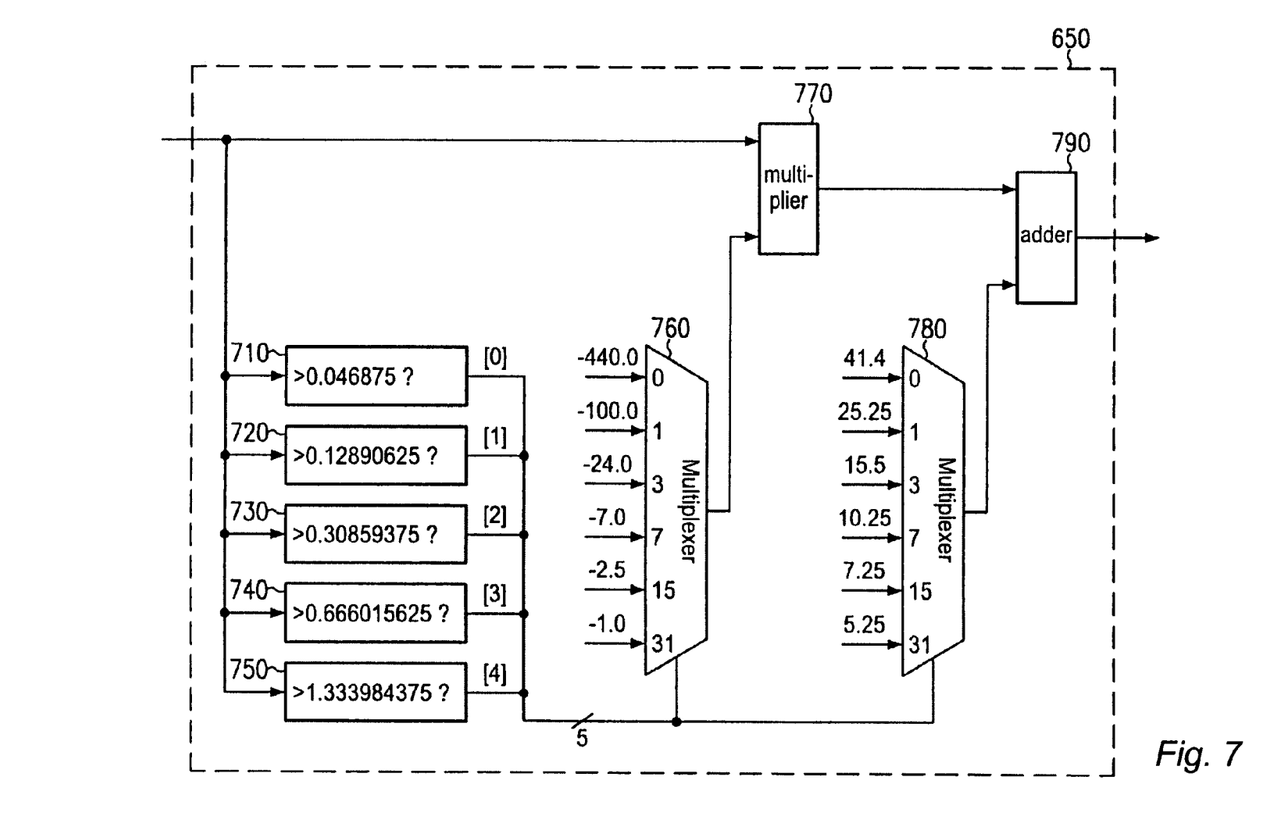
FIG. 7 illustrates the components of an approximation unit according to an embodiment.

FIG. 7 illustrates the components of the approximation unit 650 in more detail. The averaged power received from multiplier 640 is supplied to five comparators 710–750 for determining the subrange into which the averaged power falls. It is to be noted that the power range at the output of analog-to-digital converter 220 is already limited to a given power range, since the automatic gain control unit 210 already performs an initial control. The width of the given power range may therefore depend on the precision of the automatic gain control unit 210.

In the present embodiment, the given power range may be divided into the following six subranges $[x_i, x_{i+1}]$:

| i | $x_i$ |
|---|---|
| 1 | 0 |
| 2 | 0.046875 |
| 3 | 0.12890625 |
| 4 | 0.30859375 |
| 5 | 0.666015625 |
| 6 | 1.333984375 |

The power range is subdivided into the subranges such that the reciprocal square root function may be approximated by six linear functions leading to a deviation from the real function of not more than 0.5 dB. It is to be noted that the border values of the subranges may be quantized according to the bit widths of the comparators 710–750. Moreover, it is to be noted that the number of subranges may be increased to increase accuracy of the approximation.

As in the present embodiment six subranges are used, the approximation unit 650 comprises five comparators 710–750, i.e. one less than the number of subranges. Once the subrange into which the measured power falls is determined, the approximation unit 650 may control multiplexers 760, 780 to select the correct functional coefficients to perform a linear interpolation using multiplier 770 and adder 790 to apply the respective linear function where x is proportional to the input power, and y is proportional to the normalization factor to be used:

| i | y |
|---|---|
| 1 | 41.5–440.0 x |
| 2 | 25.25–100 x |
| 3 | 15.5–24.0 x |
| 4 | 10.25–7.0 x |
| 5 | 7.25–2.5 x |
| 6 | 5.25–1.0 x |

The linear approximation in each of the subranges is illustrated in FIGS. 8 and 9. These figures are diagrams showing the reciprocal square root function together with the above listed linear functions. As apparent from these diagrams, the reciprocal square root function can be accurately approximated, thereby avoiding the requirement to provide circuitry for calculating the real square root function and inverting this numeric result.

In the embodiments described above, the power normalization is done as long as a preamble portion in the incoming data stream is received. Once the normalization factor is determined, this factor is used for the remainder of the frame. In another embodiment, the power normalization may be continuously performed during the entire frame.

Figure 10:
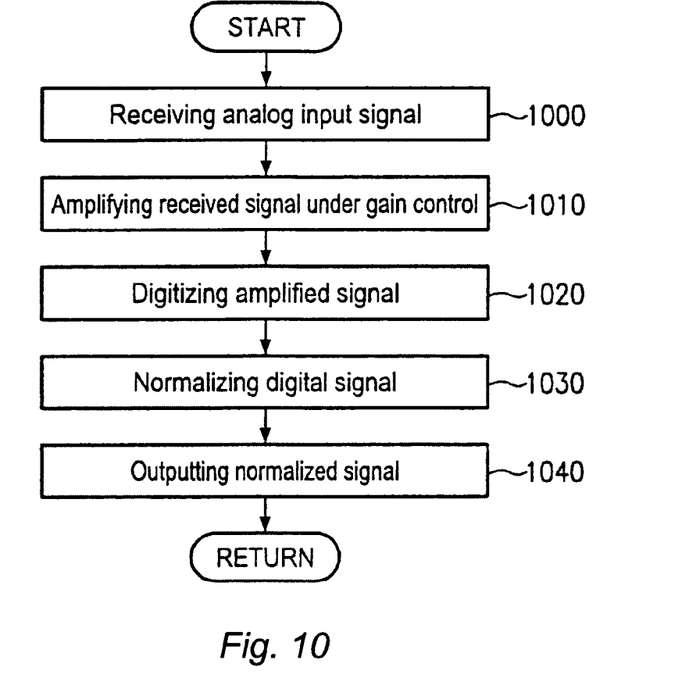
FIG. 10 is a flow chart illustrating the process of operating a WLAN receiver according to an embodiment.

Turning now to FIG. 10, a flow chart is shown illustrating the process of operating the WLAN receiver according to one of the above embodiments. In step 1000, an analog input signal is received which is then amplified under gain control by the automatic gain control unit 210 (step 1010). The amplified signal is digitized by analog-to-digital converter 220 in step 1020, and the digitized signal is normalized in step 1030 using the power normalization unit 400. Finally, the normalized signal is output in step 1040.

Figure 11:
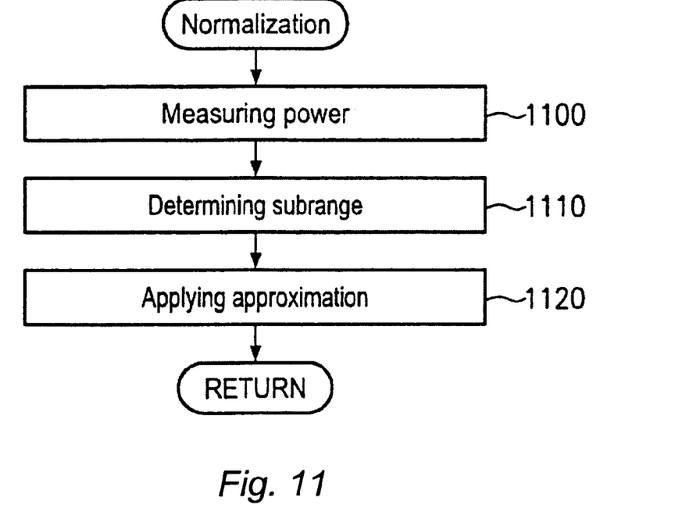
FIG. 11 is a flow chart illustrating the process of performing power normalization according to an embodiment.

The step 1030 of normalizing the digital signal is illustrated in more detail with reference to FIG. 11. First, the power (or energy) is measured in step 1100, e.g. by averaging over a number of complex data samples. Then, the subrange into which the measured power falls, is determined in step 1110. Finally, the approximation of the reciprocal square root function is applied in step 1120 to obtain the normalization factor.

Thus, the above embodiments use an analog automatic gain control unit 210 and a digital power normalization unit 400 in a manner so as to reduce the number of hardware components needed to perform the respective functions, and at the same time resulting in a short settling time without decreasing the precision of the overall data processing function. Because the range of the output power of the analog automatic gain control unit 210 is generally known, the linear interpolation may be limited to this range, resulting in even fewer hardware components. Moreover, by subdividing the power range and applying power normalization functions dependent on the respective subrange, simplified circuitry may be used by avoiding the calculation of the reciprocal square root function.

The WLAN receiver of the above embodiments is IEEE 802.11b compliant. Moreover, the above embodiments may be realized in an integrated circuit chip such as those used in computer chipsets.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein.

Accordingly, it is to be understood that the invention is not to be limited by the specific illustrative embodiments, but only by the scope of the appended claims.

What is claimed is:

1. A WLAN (Wireless Local Area Network) receiver having a power normalization unit connected to receive an input signal having a signal power within a given power range, said power normalization unit being capable of outputting an output signal derived from said input signal by applying one of at least two different power normalization functions to said input signal, said power normalization unit comprising:
   a power determination unit for determining said signal power; and
   a function selection unit for determining one of at least two subranges of said power range, the determined subrange including said signal power, and selecting one of said at least two power normalization functions dependent on the determined subrange.

2. The WLAN receiver of claim 1, wherein said at least two power normalization functions are linear functions having predetermined functional coefficients.

3. The WLAN receiver of claim 1, wherein each of said at least two power normalization functions is chosen to approximate a reciprocal square root function in one of said at least two subranges.

4. The WLAN receiver of claim 1, wherein said power determination unit comprises a square calculation unit for squaring said input signal.

5. The WLAN receiver of claim 4, wherein said square calculation unit comprises a multiplier receiving said input signal twice for squaring said input signal.

6. The WLAN receiver of claim 1, wherein said power determination unit comprises an average calculation unit for averaging over a predefined number of input signal samples.

7. The WLAN receiver of claim 6, wherein said predefined number of input signal samples is chosed to be the number of samples in a Barker symbol.

8. The WLAN receiver of claim 7, wherein said number of samples in a Barker symbol is twenty-two.

9. The WLAN receiver of claim 6, wherein said predefined number of input signal samples is chosed to be a multiple of the number of samples in a Barker symbol.

10. The WLAN receiver of claim 9, wherein said predefined number of input signal samples is chosed to be four times the number of samples in a Barker symbol.

11. The WLAN receiver of claim 6, wherein said average calculation unit is switchable between two different predefined numbers of input signal samples used for averaging.

12. The WLAN receiver of claim 11, further comprising:
a frame detection unit for detecting the start of a frame in the input signal,
wherein said average calculation unit is arranged for averaging over a first predefined number of input signal samples before said frame detection unit has detected the start of a frame, and averaging over a second predefined number of input signal samples after said frame detection unit has detected the start of the frame, the first predefined number being different from the second predefined number.

13. The WLAN receiver of claim 12, wherein the second predefined number is greater than the first predefined number.

14. The WLAN receiver of claim 13, wherein the second predefined number is greater than the first predefined number by a factor of four.

15. The WLAN receiver of claim 1, wherein said power determination unit is arranged for separately determining a first and a second signal power of said input signal, the first signal power relating to the real part of said input signal, and the second signal power relating to the imaginary part of said input signal.

16. The WLAN receiver of claim 15, wherein said power determination unit comprises an adder for calculating the sum of said first and a second signal powers.

17. The WLAN receiver of claim 1, wherein said power determination unit comprises a data sampling unit for sampling incoming data to generate said input signal.

18. The WLAN receiver of claim 1, wherein said power determination unit and said function selection unit are arranged for determining said signal power and selecting one of said power normalization functions as long as a preamble portion of said input signal is received, and keeping the selected power normalization function unchanged for the remainder of the frame.

19. The WLAN receiver of claim 1, wherein said power determination unit and said function selection unit are arranged for continuously being operated during the entire length of a frame in said input signal.

20. The WLAN receiver of claim 1, wherein said power normalization unit is arranged for applying said one power normalization function to said input signal by obtaining a normalization factor and multiplying said input signal by said normalization factor.

21. The WLAN receiver of claim 1, wherein said power normalization unit is arranged for receiving said input signal from an analog-to-digital converter that digitizes the output signal of an automatic gain control unit.

22. The WLAN receiver of claim 1, wherein said power normalization unit is arranged for outputting said output signal to a digital signal processing unit of said WLAN receiver.

23. The WLAN receiver of claim 1, wherein:
said function selection unit is arranged for determining one of a first predefined number of subranges of said power range, said first predefined number being an integer number of at least two; and
said function selection unit comprises a second predefined number of comparators, said second predefined number being equal to said first predefined number reduced by one.

24. The WLAN receiver of claim 23, wherein said first predefined number is six and said second predefined number is five.

25. The WLAN receiver of claim 1, wherein the number of different power normalization functions used by said power normalization unit is selected to keep an error in said output signal below a given limit.

26. The WLAN receiver of claim 25, wherein said limit is 0.5 dB.

27. The WLAN receiver of claim 1, being IEEE 802.11b compliant.

28. An integrated circuit chip for performing power normalization in a WLAN (Wireless Local Area Network) receiver, the integrated circuit chip having power normalization circuitry receiving an input signal having a signal power within a given power range, said power normalization circuitry being capable of outputting an output signal derived from said input signal by applying one of at least two different power normalization functions to said input signal, said power normalization circuitry comprising:
power determination circuitry for determining said signal power; and
function selection circuitry for determining one of at least two subranges of said power range, the determined subrange including said signal power, and selecting one of said at least two power normalization functions dependent on the determined subrange.

29. A method of performing a power normalization in a WLAN (Wireless Local Area Network) receiver, said method comprising:
receiving an input signal having a signal power within a given power range;
determining said signal power;
determining one of at least two subranges of said power range, the determined subrange including said determined signal power;
selecting one of said at least two power normalization functions dependent on the determined subrange; and
outputting an output signal derived from said input signal by applying said selected power normalization function to said input signal.

30. The method of claim 29, wherein said at least two power normalization functions are linear functions having predetermined functional coefficients.

31. The method of claim 29, wherein each of said at least two power normalization functions is chosen to approximate a reciprocal square root function in one of said at least two subranges.

32. The method of claim 29, wherein said step of determining said signal power comprises:
squaring said input signal.

33. The method of claim 32, wherein said step of squaring said input signal comprises:
multiplying said input signal by said input signal itself.

34. The method of claim 29, wherein said step of determining said signal power comprises:
averaging over a predefined number of input signal samples.

35. The method of claim 34, wherein said predefined number of input signal samples is chosed to be the number of samples in a Barker symbol.

36. The method of claim 35, wherein said number of samples in a Barker symbol is twenty-two.

37. The method of claim 34, wherein said predefined number of input signal samples is chosed to be a multiple of the number of samples in a Barker symbol.

38. The method of claim 37, wherein said predefined number of input signal samples is chosed to be four times the number of samples in a Barker symbol.

39. The method of claim 34, wherein said step of averaging over a predefined number of input signal samples comprises:
switching between two different predefined numbers of input signal samples.

40. The method of claim 39, further comprising:
detecting the start of a frame in the input signal,
wherein said step of averaging is arranged for averaging over a first predefined number of input signal samples before the start of a frame has been detected, and averaging over a second predefined number of input signal samples after the start of the frame has been detected, the first predefined number being different from the second predefined number.

41. The method of claim 40, wherein the second predefined number is greater than the first predefined number.

42. The method of claim 41, wherein the second predefined number is greater than the first predefined number by a factor of four.

43. The method of claim 29, wherein said step of determining said signal power is arranged for separately determining a first and a second signal power of said input signal, the first signal power relating to the real part of said input signal, and the second signal power relating to the imaginary part of said input signal.

44. The method of claim 43, wherein said step of determining said signal power comprises:
calculating the sum of said first and a second signal powers.

45. The method of claim 29, wherein said step of determining said signal power comprises:
generating data samples of incoming data to generate said input signal.

46. The method of claim 29, wherein said steps of determining said signal power and selecting one of said power normalization functions are arranged for determining said signal power and selecting one of said power normalization functions as long as a preamble portion of said input signal is received, and keeping the selected power normalization function unchanged for the remainder of the frame.

47. The method of claim 29, wherein said steps of determining said signal power and selecting one of said power normalization functions are continuously operated during the entire length of a frame in said input signal.

48. The method of claim 29, arranged for applying said one power normalization function to said input signal by obtaining a normalization factor and multiplying said input signal by said normalization factor.

49. The method of claim 29, further comprising:
receiving said input signal from an analog-to-digital converter that digitizes the output signal of an automatic gain control unit.

50. The method of claim 29, further comprising:
outputting said output signal to a digital signal processing unit of said WLAN receiver.

51. The method of claim 29, wherein the number of different power normalization functions used by said power normalization unit is selected to keep an error in said output signal below a given limit.

52. The method of claim 51, wherein said limit is 0.5 dB.

53. The method of claim 29, for performing a power normalization in an IEEE 802.11b compliant WLAN receiver.

* * * * *